Oct. 5, 1965

R. J. REEK 3,210,569

TRANSISTORIZED DISTRIBUTOR OR COUNTER HAVING PARTICULAR IMPEDANCE CONNECTIONS BETWEEN COLLECTORS AND BASES

Filed July 10, 1962

INVENTOR
ROBERT J. REEK

BY R C Terry
ATTORNEY

United States Patent Office 3,210,569

Patented Oct. 5, 1965

3,210,569
TRANSISTORIZED DISTRIBUTOR OR COUNTER HAVING PARTICULAR IMPEDANCE CONNECTIONS BETWEEN COLLECTORS AND BASES

Robert J. Reek, Mount Prospect, Ill., assignor to Teletype Corporation, Skokie, Ill., a corporation of Delaware Filed July 10, 1962, Ser. No. 208,834
5 Claims. (Cl. 307—88.5)

This invention relates to ring type distributors or counters and more particularly to ring distributors employing a single amplifying device per stage.

Previous transistor ring counters employing a single transistor per stage generally used point contact transistors. This type of transistor was utilized since it has a negative resistance characteristic having two stable states of conduction separated by an unstable region. When a plurality of point contact transistors are employed as a ring counter, one transistor is in a first stable state of conduction and all the remaining transistors are in a second stable state of conduction. Since they have two stable operating states, negative resistance devices are a logical choice for ring counter operation. However, point contact transistors exhibit unstable characteristics under many operating conditions, are difficult to manufacture, and have other distinct disadvantages when compared with junction transistors.

Although junction transistors are more stable than point contact transistors, have greater reliability and are the most common in present use, previous attempts to use a single junction transistor per stage in a ring counter generally failed since junction transistors are not negative resistance devices.

Prior to this invention, if junction transistors were used in a ring distributor or counter circuit, it was usually necessary to connect them in bistable flip-flop configurations using two transistors per stage in order to obtain the desired negative resistance characteristic for the pair. In such circuits one transistor in each stage conducts at all times. Although the operation of a ring counter employing a junction transistor flip-flop circuit in each stage gives reliable results, it is extravagant in it use of circuit elements and wasteful of power in that each stage conducts at all times.

It is an object of this invention to provide an improved, reliable distributor or counter with a multitude of stages each employing a single transistor in which a train of pulses causes successive changes in the conduction states of succeeding stages.

It is another object of this invention to provide a ring distributor using a single junction transistor per stage.

It is still another object of this invention to provide a multi-stage transistor ring distributor using junction transistors connected in cascade wherein maintenance of a transistor in a first state of conduction biases all the other stages to a second state of conduction and prevents them from attaining the first state of conduction.

In accordance with this invention a multi-stage distributor or counter circuit is provided with each stage including a single junction transistor having base, collector and emitter electrodes. Each of the collectors is connected through a load resistor to a common source of negative potential, and each of the emitters is connected to a common lead upon which operating pulses are applied. The collector of each transistor is also connected to the base of the next succeeding transistor through a capacitor and a resistance connected in parallel and is connected to the bases of the remaining transistors through unidirectional conducting devices or diodes which clamp the bases to the potential of the particular collectors to which they are connected.

In the circuit network just described, one transistor stage assumes a conductive state, and by means of the connections between its collector and the bases of the other transistors, it biases all the other stages to a nonconductive state. Upon application of an operating pulse to the common emitter lead, the conducting transistor is rendered nonconducting and thereupon applies a pulse through the capacitive coupling to the base of the next succeeding transistor. This pulse on the base of the next succeeding transistor causes that transistor to become conductive upon removal of the common emitter pulse. The conductive transistor then applies a biasing potential through the resistor connected between its collector and the base of the next succeeding transistor and through the diodes connected to the bases of the remaining transistors to bias all these transistors to a nonconductive state.

Other objects and features of this invention will become apparent to those skilled in the art, from the following detailed description taken in conjunction with the drawing wherein.

Figures 1, 2:
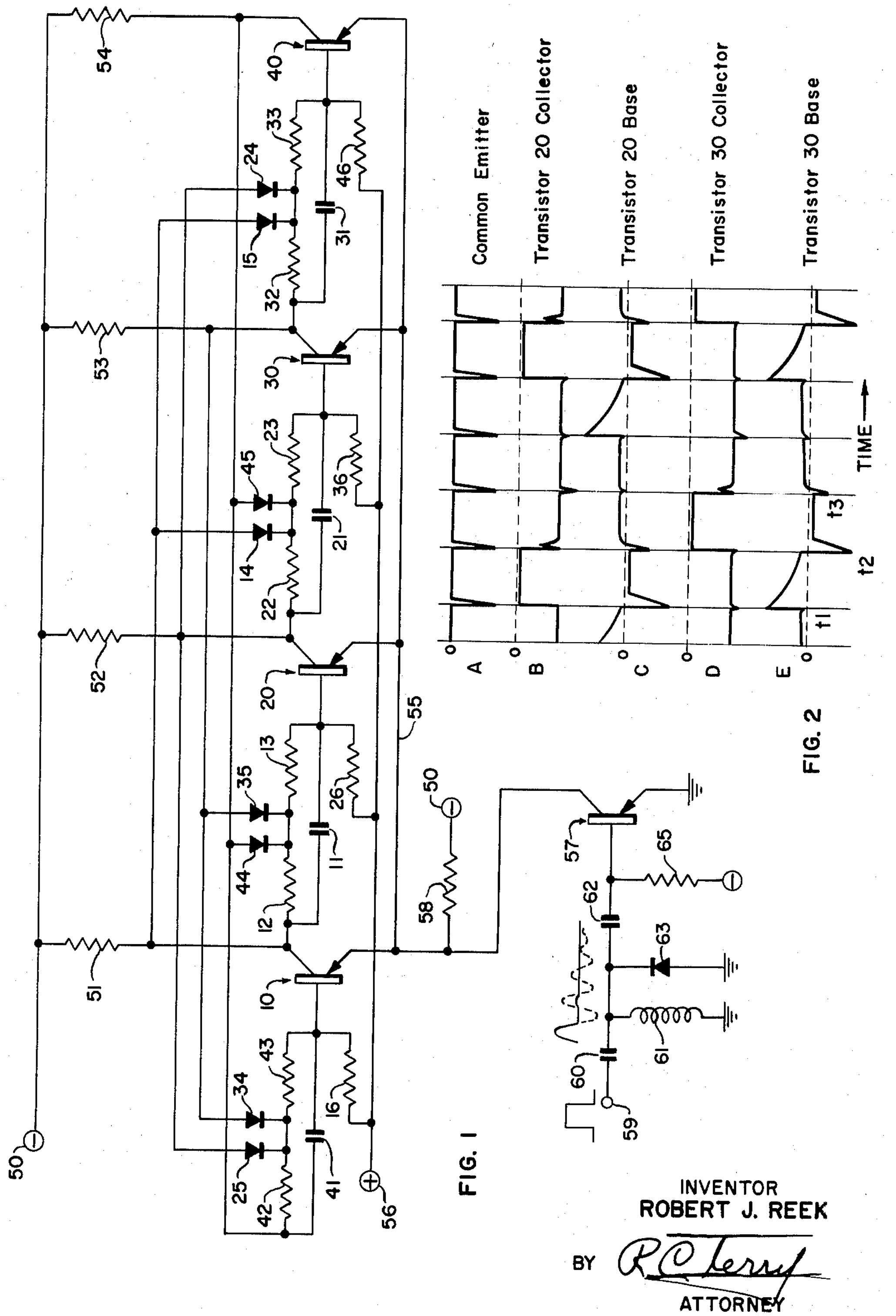
FIG. 1 is a circuit diagram embodying the features of the invention.
FIG. 2 shows waveforms useful in explaining the operation of the circuit of FIG. 1.

Referring now to FIG. 1, there is shown a four-stage transistor ring distributor including four PNP junction transistors 10, 20, 30 and 40, the collectors of which are connected to a common source of negative potential 50 through load resistors 51, 52, 53 and 54, respectively, and the emitters of which are connected to a common emitter lead 55. The collector of the transistor 10 is connected to the base of the transistor 20 through a capacitor 11 and also through a pair of resistors 12 and 13 connected in series. In a like manner the collector of each of the transistors 20, 30 and 40 is connected to the base of the next succeeding transistor through capacitors 21, 31 and 41 and resistors 22 and 23, 32 and 33, and 42 and 43, respectively, thus forming a closed loop. The collectors of each of the transistors 10, 20, 30 and 40 also are connected to the bases of each of the other transistors, except the next succeeding one, by means of unidirectional conducting devices or diodes 14 and 15, 24 and 25, 34 and 35, and 44 and 45, respectively, which are connected to respective junctions of the resistors 12 and 13, 22 and 23, 32 and 33, and 42 and 43.

A bias potential for the bases of the transistors 10, 20, 30 and 40 is obtained from a positive source 56 through biasing resistors 16, 26, 36 and 46, respectively.

The common lead 55 is connected to the junction between one terminal of a resistor 58 and the collector of a normally conducting driver transistor 57, the emitter of which is connected to ground. The other terminal of the resistor 58 is connected to the source of negative potential 50. The base of the transistor 57 is supplied with a series of positive input pulses from a suitable source (not shown) at terminal 59. These pulses are passed through a wave shaping network comprised of a pair of capacitors 60 and 62 and an inductance 61 which is responsive to the leading edge of the pulse and causes it to be shaped into a damped sinusoidal waveform. Only the first positive half cycle of this damped waveform is supplied to the base of the transistor 57 to momentarily turn it OFF by overcoming the negative operating bias applied to the base thereof from a source of negative potential through a biasing resistor 65. The energy remaining in the sinusoidal waveform after the first positive half cycle is shunted to ground through a diode 63 and has no further affect on the transistor 57.

Consider now the operation of the distributor which has been described above. Assume that the transistor 20 is conducting and that the transistors 10, 30 and 40 are not conducting. This assumption may be made due to the inherent nature of the transistors coupled with the particular circuitry of the ring distributor shown in FIG. 1, that is, one transistor is bound to become forward biased when power is placed on the circuit. When the transistor 20 is conducting, its collector is at near ground potential which it obtains from the emitter of the driver transistor 57 which is normally conducting. The potential on the collector of the transistor 20 is applied to the junctions of the resistors 32 and 33 and of the resistors 42 and 43 by means of the diodes 24 and 25. This near ground potential applied to these junctions in turn causes the potential on the bases of the transistors 10 and 40 to become positive from the source 56 through the resistors 16 and 46, thus back biasing transistors 10 and 40 to nonconduction since the emitters of these transistors are held at near ground potential when transistor 57 conducts. The transistor 30 is back biased to nonconduction because the ground potential on the collector of the transistor 20 is applied to the resistor 22 which causes a positive potential from the source 56 to be placed on the base of the transistor 30 by means of biasing resistor 36.

When an input pulse is applied to the base of the driver transistor 57, it causes the transistor 57 to be momentarily cut off. The potential at its collector then momentarily drops near to the negative potential of the source 50. This negative potential is applied through the common lead 55 as a sharp negative trigger or operating pulse to the emitters of the transistors 10, 20, 30 and 40. The previously conducting transistor 20 is now rendered nonconductive by this negative pulse since its emitter is driven negative with respect to the potential on its base. The negative operating pulse has no affect on the previously nonconducting transistors 10, 30, and 40. When the transistor 20 is momentarily rendered nonconducting, the potential at its collector drops causing a negative pulse to be applied by means of the capacitor 21 to the base of the transistor 30. This negative pulse is of sufficient magnitude to overcome the positive bias applied to the base of the transistor 30, and the transistor 30 is momentarily rendered conductive as soon as the negative trigger pulse on the lead 55 is removed or decays.

When the transistor 30 conducts, its collector potential rises nearly to ground causing near ground potential to be applied to the resistor 32. This in turn causes a positive potential to be applied to the base of the transistor 40 by means of the biasing resistor 46 from the source 56 thereby causing the transistor 40 to be held in its nonconductive state. The near ground potential present on the collector of transistor 30 is also applied to the junctions of the resistors 12 and 13 and of the resistors 42 and 43 through the diodes 35 and 34. This results in the application of a positive potential on the bases of the transistors 10 and 20 through the biasing resistors 16 and 26 from the source 56 thereby biasing the transistors 10 and 20 to their nonconductive state. The negative potential present on the collector of the nonconductive transistor 20 is applied to the base of the transistor 30 by means of the resistors 22 and 23 to hold the transistor 30 in its conductive state.

Once these dynamic or transitory conditions of conduction and nonconduction of the transistors are obtained, the circuit maintains itself in the same states of conduction until application of the next input pulse to the base of the transistor 57. Successive input pulses cause the conducting stage of the distributor to advance one stage at a time in the same manner as discussed above for transistors 20 and 30.

An understanding of the operation of the circuit shown in FIG. 1 may be further enhanced by reference to FIG. 2, which shows the changes in potentials for the transistors 20 and 30 in response to operating pulses. Since the other stages including the transistors 10 and 40 have waveforms similar to those shown for the transistors 20 and 30, they have not been shown in order to avoid unnecessary repetition. However, the following discussion of the operation of the transistors 20 and 30 is equally applicable to the transistors 10 and 40.

The operating pulses applied to the common emitter lead 55 are denoted by waveform A. In waveform B is shown the voltage condition of the collector of the transistor 20 with respect to ground. This waveform indicates that during conduction of the transistor, the collector potential for practical purposes is at ground and that during nonconduction, the collector potential is considerably below ground at approximately the negative supply voltage 50. Waveform C illustrates the potential conditions on the base of the transistor 20. Waveform D shows the potential conditions on the collector of the transistor 30, and it will be noted that waveform D is similar in all respects to waveform B except that it is delayed by one full timing interval. Waveform E illustrates the potential differences on the base of the transistor 30, and it also is to be noted that this waveform is similar to waveform C except that it is delayed by one full timing interval from waveform C.

Upon application of an operating pulse A to the common emitter lead 55 at time *t2*, the emitter of the transistor 20 is driven negative with respect to its base and the transistor 20 is rendered nonconductive. This is represented in waveform B by the sharp drop in the collector potential of the transistor 20 from near ground to a negative potential. The resulting negative potential is applied to the capacitor 21 which causes a negative pulse to be applied to the base of the transistor 30. This negative pulse is shown in waveform E at time *t2*. It is to be noted that the negative pulse applied to the base of the transistor 30 at time *t2* is of longer duration than the operating pulse applied to the common emitter lead 55. This is necessary in order to cause the base of the transistor 30 to be more negative than the emitter thereof after termination of the operating pulse on lead 55 and is the key to the dynamic transfer of conduction of the counter. When the base of the transistor 30 is more negative than its emitter, the transistor 30 conducts and its collector potential rises as shown in curve D. Upon application of the next operating pulse, the transistor 30 is rendered nonconductive and this is represented by the drop in its collector potential at time *t3* as shown in curve D.

During periods of nonconduction, the bases of the transistors are biased to a positive potential with respect to ground. This is shown in waveforms C and E by the gradual rise in potential following the application of the operating pulses which rendered the respective transistors 20 and 30 nonconductive. As stated previously, this positive biasing potential is caused by the feedback from the collector of the conducting transistor through the resistive connection to the base of the next succeeding transistor and through the diodes to the bases of the other transistors. The reason for the gradual rise in potential shown in waveforms C and E is that the capacitance and resistance between each collector and the base of the next succeeding stage act as an RC filter to give the rise time shown. These components, therefore, are important factors in determining the limiting speed of operation of the distributor.

The sharp rise in potential on the base of the transistor 30 at time *t1* occurs when the transistor 20 is rendered conductive. This results in a positive pulse being applied to the base of the transistor 30 by means of the coupling capacitor 21 connected between the collector of the transistor 20 and the base of the transistor 30. Since the transistor 30 is already biased to nonconduction prior to the application of this high positive pulse, the pulse is of no significance since it does not change the conductive state. In a like manner a sharp positive pulse is applied to the base of the transistor 20 when transistor 10 is rendered conductive.

Outputs from the network shown in FIG. 1 may be taken from the collectors of the transistors in any or all stages as desired. When the network is utilized as a distributor, outputs are taken off each of the collectors of the transistors 10, 20, 30 and 40. In a situation where it is desired to use the network as a frequency divider, the application of pulses to the terminal 59 can be considered the input frequency. Then, in order to divide this frequency, an output is taken off one or more of the collectors of the transistors 10, 20, 30 and 40 and OR gated to a single output lead. It is to be further understood that the disclosed number of stages is merely illustrative and that the number of stages may be reduced or extended by the simple subtraction or addition of stages containing component elements as shown associated with each stage in FIG. 1.

It is to be noted that only the leading edge of the input pulses applied to the terminal 59 is utilized to form operating pulses for the circuit. Consequently, input pulses of varying time duration above a predetermined minimum may be used since the duration of the pulse is of no significance. The circuitry connected to the base of the driver transistor 57 is particularly suited for situations wherein the input pulses have varying amplitudes. The amplitude of the input pulses may vary as much as 20 percent; but as a result of the wave shaping network used, accurate operation of the circuit occurs. If the input pulses are of relatively constant amplitude, it is possible to dispense with the wave shaping network shown and to utilize a simple differentiating circuit connected to the base of the driver transistor 57.

While the circuit of FIG. 1 shows the use of PNP transistors throughout, NPN transistors may be substituted if desired. Of course, the polarities of the diodes, power supply, and input pulses would have to be reversed It is to be understood that the above-described circuit is merely illustrative of the principles of the invention and that various changes and modifications may be made by those skilled in the art without departing from the spirit and scope of the invention.

What is claimed is:

1. A ring type distributor including
(a) a plurality of transistors each having at least base and collector electrodes,
(b) means connecting all the collectors of said transistors to a common source of potential with one of said transistors in a first state of conduction,
(c) means for applying pulses to all of said transistors, each of said pulses being effective to cause a transistor in said first state of conduction to be placed in a second state of conduction,
(d) parallel first and second means connecting the collector of each of said transistors with the base of the next succeeding transistor, said first connecting means being effective to apply the change from said first state of conduction to said second state of conduction of a transistor as an operating pulse to place the next succeeding transistor in said first state of conduction, and said second connecting means being effective to apply the potential on the collector of a transistor in said first state of conduction to the base of the next succeeding transistor as a bias potential to hold said next succeeding transistor in said second state of conduction, and
(e) unidirectional current devices connecting the collector of each of said transistors to the bases of the remainder of said transistors except the next succeeding transistor for applying the potential on the collector of each of said transistors to the bases of said remainder of said transistors.

2. In a distributor,
(a) a plurality of transistors connected in cascade, each of said transistors having at least base and collector electrodes,
(b) means connecting all the collectors of said transistors to a common source of potential with one of said transistors conductive and the other transistors nonconductive,
(c) means for applying a pulse to all of said transistors to render said conductive transistor nonconductive,
(d) capacitive means connecting the collector of each of said transistors to the base of the next succeeding transistor for applying a pulse of sufficient magnitude to place the next succeeding transistor in a conducting state whenever a conducting transistor is rendered nonconductive,
(e) resistive means connecting the collector of each of said transistors to the base of the next succeeding transistor for applying the potential on the collector of a conducting transistor as a conduction preventing bias potential to the next succeeding transistor, and
(f) diodes connecting the collector of each of said transistors to the bases of each of the rest of said transistors except the next succeeding transistor for applying the potential on the collector of each of said transistor to the bases of said rest of said transistors.

3. A ring counter circuit including
(a) a plurality of transistors connected in cascade, each of said transistors having base, emitter and collector electrodes,
(b) means connecting all the collectors to a common source of potential with only one of said transistors conductive at any given time,
(c) means for applying an operating pulse to the emitters of all of said transistors simultaneously to cause the conductive transistor to be placed in a nonconductive state,
(d) capacitive means coupling the collector of each of said transistors to the base of the next succeeding transistor for applying a pulse of sufficient magnitude to bias the next succeeding transistor to a conductive state whenever a conductive transistor is rendered nonconductive,
(e) additional means connecting the collector of each of said transistors to the base of the next succeeding transistor for applying the potential on the collector of a conducting transistor as a conduction preventing bias potential to the next succeeding transistor, and
(f) diodes connecting the collector of each of said transistors to the bases of the other transistors except the next succeeding transistor for applying the potential on the collector of each of said transistors to the bases of said other transistors.

4. In a ring counter circuit,
(a) a series of transistors, each of said transistors having base, emitter and collector electrodes,
(b) a common source of potential connected to all the collectors to render only one of said transistors conductive at any given time,
(c) means for applying an operating pulse to the emitters of all of said transistors simultaneously to cause the conductive transistor to be rendered nonconductive,
(d) a capacitor connected between the collector of each transistor and the base of the next succeeding transistor to apply a pulse of sufficient magnitude to bias the next succeeding transistor to a conductive state whenever a conductive transistor is rendered nonconductive by said operating pulse,
(e) additional means connected between the collector of each of said transistors and the base of the next succeeding transistor for applying the potential on the collector of a conducting transistor as a conduction preventing bias potential to the next succeeding transistor, and
(f) a diode connected between the collector of each transistor and the base of each of the other transistors except the next succeeding transistor for applying the potential on the collector of a conducting transistor as a conduction preventing bias potential for said other transistors.

5. A ring distributor including (a) $n$ transistors each having base, emitter and collector electrodes where $n$ is a positive integer greater than one, (b) a common source of potential connected to all the collectors whereby only one of said transistors is rendered conductive at any given time, (c) means for simultaneously applying an operating pulse to all the emitters to cause the conductive transistor to be rendered nonconductive, (d) a capacitance connected between the collector of each transistor and the base of the next succeeding transistor to apply a pulse of sufficient magnitude to bias the next succeeding transistor to a conductive state whenever a conductive transistor is rendered nonconductive by said operating pulse, (e) a resistance connected between the collector of each of said transistors and the base of the next succeeding transistor for applying the potential on the collector of a conducting transistor as a conduction preventing bias potential to the next succeeding transistor, and (f) $n-2$ diodes for each transistor, one of said diodes connected between the collector of each transistor and the base of each of the other of said $n$ transistors except the next succeeding transistor for applying the potential on the collector of a conducting transistor as a conduction preventing bias potential to the bases of said other transistors.

References Cited by the Examiner

UNITED STATES PATENTS

| | | | |
|---|---|---|---|
| 2,876,365 | 3/59 | Slusser | 307—88.5 |
| 2,912,578 | 11/59 | Van Durren et al. | |
| 3,005,917 | 10/61 | Hofmann | 307—88.5 |

ARTHUR GAUSS, *Primary Examiner.*